United States Patent [19]

Isozaki et al.

[11] Patent Number: 4,888,210

[45] Date of Patent: Dec. 19, 1989

[54] METHOD FOR MAKING TRANSPARENT CONDUCTIVE FILM

[75] Inventors: Yasuhito Isozaki, Neyagawa; Kazuyuki Okano, Katano; You Hasegawa, Nara, all of Japan

[73] Assignee: Matsushita Electric Industrial Co., Ltd., Kadoma, Japan

[21] Appl. No.: 97,474

[22] Filed: Sep. 16, 1987

[30] Foreign Application Priority Data

Sep. 17, 1986 [JP] Japan .................. 61-220602

[51] Int. Cl.⁴ .............................. B05D 5/12
[52] U.S. Cl. ................... 427/126.3; 427/108; 427/126.2; 427/164; 427/165; 427/226; 427/377; 427/380
[58] Field of Search ............ 427/226, 380, 377, 126.3, 427/126.2, 108, 164, 165

[56] References Cited

U.S. PATENT DOCUMENTS 3,676,729  7/1972  Menelly .................. 427/108
4,069,357  1/1978  Miller et al. .............. 427/126.2
4,202,917  5/1980  Ishii et al. ................ 427/377
4,325,987  4/1982  Kalbskopf et al. ......... 427/126.3
4,568,578  2/1986  Arfsten et al. ............. 427/108

FOREIGN PATENT DOCUMENTS 0080349  6/1983  European Pat. Off. .
2021083  11/1979  United Kingdom .

*Primary Examiner*—Janyce Bell
*Attorney, Agent, or Firm*—Cushman, Darby & Cushman

[57] ABSTRACT

The present invention relates to a method for making a transparent conductive film, wherein a material for the film containing an organic indium compound and an organic tin compound is applied on a substrate, and made to thermally decompose, and thereafter, a heat treatment of the material is carried out in an atmosphere containing water vapor, thereby obtaining the transparent conductive film which shows low and stable electric resistance and is excellent in water resistance and chemical resistance, and is without undesirable cloudiness.

11 Claims, 1 Drawing Sheet

METHOD FOR MAKING TRANSPARENT CONDUCTIVE FILM

FIELD OF THE INVENTION AND RELATED ART STATEMENT

1. FIELD OF THE INVENTION

The present invention generally relates to transparent conductive films, and more particularly to methods for making the transparent conductive films to be used for transparent electrodes which are used in various electronic devices such as liquid crystal display devices and transparent membrane switches or the like.

2. DESCRIPTION OF THE RELATED ART

Heretofore, transparent conductive films have been widely used for liquid crystal display devices, transparent electro-magnetic shields, an infrared reflection film, transparent membrane switches or the like.

As the transparent conductive film, tin doped indium oxide films, antimony doped tin oxide films and metal films such as gold film are known. These conventional transparent conductive films have been formed by a vacuum evaporation method, a sputtering method, a thermal decomposition method or the like.

However, a vacuum evaporation and a sputtering must be carried out in a vacuum chamber, and therefore the vacuum evaporation method and the sputtering method are inefficient in productivity and further are not suitable for making the films having large area. On the other hand, in the thermal decomposition method, a film material is applied on the substrate by a printing method or a dipping method and is thermally decomposed and sintered in the air without using the vacuum chamber to be a transparent conductive film. Therefore, the thermal decomposition method is superior in the productivity and is suitable for making the film having large area, but it involves a problem that electric resistance of the resultant transparent conductive film is high. Japanese unexamined published patent application Sho 60-243280 discloses an invention intended to solve the above-mentioned problem, wherein the thermal decomposition is carried out in an oxygen rich atmosphere and a sintering process is carried out in an oxygen poor atmosphere. However even in this prior art, there are problems that when the sintering is carried out in dry atmosphere, the electric resistance of the resultant transparent conductive film is not stable, and easily changes in contact with moisture or chemicals.

Moreover, Japanese unexamined published patent application Sho 59-213623 discloses a thermal decomposition method, wherein a film is heated in a reductive atmosphere containing water vapor and below 3% by weight of oxygen. However, there are problems that when the thermal decomposition is carried out in a water vapor rich atmosphere, the film is liable to be cloudy, and furthermore, in case that after the heat decomposition the film is treated in an oxidative atmosphere, the electric resistance thereof becomes high.

OBJECT AND SUMMARY OF THE INVENTION

The present invention aims to obtain a transparent conductive film which is splendid in water resistance and chemical resistance without inducing high electric resistance.

The other object of the present invention is to provide a method for making the transparent conductive film, wherein the transparent conductive film having large area can be easily made in high productivity.

These objects are accomplished by a method for making the transparent conductive film which comprises:

a process of applying a material for the transparent conductive film containing organic indium compound and organic tin compound on a substrate, a process of a thermal decomposition of the material, and a process of a heat treatment of the thermally decomposed material in an atmosphere containing water vapor.

In the method of the present invention, the organic indium compound and the organic tin compound are dissolved in a solvent and as occasion demands, a binder is added thereto, thereby preparing the material for the transparent conductive film. The material is applied on the substrate to form a film, and the film is then thermally decomposed. Thereafter, a heat treatment is carried out in an atmosphere such as oxidative atmosphere containing water vapor, an inert atmosphere containing water vapor or a reductive atmosphere containing water vapor, thereby to obtain the transparent conductive film.

The organic indium compounds which can be used for the present invention are indium alkoxides, organic salts of indium, organic complexes containing indium, or the like. Examples are various kinds of crown ether complexes, indium diethylacetoacetate-monoacethylacetonate, indium monoethylacetoacetate-diacethylacetonate, indium triacethylacetonate, indium trifluoroacethylacetonate, indium alcoholateacethylacetonate, indium 2-ethylhexanoate, indium octanoate, indium laurate and indium isopropionate.

As the organic tin compounds, tin alkoxides, organic salts of tin, organic complexes containing tin or the like can be used. Its Examples are crown ether complexes, tin butyrate, tin 2-ethylhexanoate, tin naphthenate, tin p-toluylate and dibutyltinbisacethylacetonate.

As the solvent for dissolving the organic indium compound and the organic tin compound, any solvent can be used, as far as they are capable of dissolving both compounds.

As the binder, for example, cellulose compounds such as nitrocellulose, ethylcellulose, hyrdoxypropylcellulose, acrylic copolymers, vinyl polymers or copolymers such as polystyrene or the like, phenolic resins are usable. The binders are preferably those which decompose or vaporize at lower temperature than thermal decomnposition temperature of the organic indium compound and the organic tin compound.

As the substrate, any substances which can withstand the thermal decomposition temperature and the heat treatment temperature of the organic indium compound and the organic tin compound are usable. Usually, the thermal decomposition and the heat treatment can be carried out below 550° C., cheap soda-lime glass can be used. Furthermore, when the thermal decomposition and the heat treatment are carried out at higher temperature than 550° C., electric resistance of the resultant transparent conductive film is lower, and humidity resistance and chemical resistance are improved.

Water vapor amount in the heat treatment atmosphere is preferably above 0.6% by volume. When the amount is below 0.6% by volume, the electric resistance of the resultant transparent conductive film is high, and mechanical strength and chemical resistance thereof are insufficient.

As the oxidative atmosphere, air may be used. The atmosphere containing smaller amount of oxygen than that of the air is preferable, since, the transparent conductive film having lower electric resistance is obtainable.

As the inert atmosphere, nitrogen, carbon dioxide, argon or the like can be optionally selected.

As the reductive atmosphere, mixed gas of hydrogen and inert gas, and hydrogen sulfide or the like can be optionally selected.

Among the above-mentioned three atmospheres, the reductive atmosphere is most preferable, because when the heat treatment is carried out in the reductive atmosphere the resultant transparent conductive film shows lowest electric resistance. Additionally, the inert atmosphere is more preferable than the oxidative atmosphere, since the former realizes the lower electric resistance than that of the latter.

As described above, features of the present invention are as follows:

The transparent conductive film having large area can be made without using a vacuum chamber. The thermal decomposition and the heat treatment are independently carried out and the water vapor is intentionally added to the heat treatment atmosphere in a process of the heat treatment, thereby enabling to produce the transparent conductive film showing low electric resistance without generating undesirable cloudiness thereof, such cloudiness has been the problem of the conventional thermal decomposition method wherein the organic compounds are thermally decomposed.

DESCRIPTION OF THE PREFERRED EMBODIMENTS

EXAMPLE 1

A solution prepared by adding 4% by weight of tin p-toluylate to indium 2-ethylhexanoate and dissolving them in kerosine is applied by printing method on a soda-lime glass substrate to form a film. Then, it is dried and thereafter it is thermally decomposed by heating it up to 530°0 C. in the air. Thereafter, the thermally decomposed film is heat treated at 530° C. for 90 minutes. The heat treatments of samples are carried out in three kinds of atmospheres containing water vapor of an oxidative atmosphere, an inert atmosphere and a reductive atmosphere. Characteristics of the resultant transparent conductive films are shown in Table 1 and FIG. 1.

TABLE 1

| Water vapor amount Vol % | Atmosphere of heat treatment | Sheet resistance Ω/□ | Transmittance % | Acid resistance |
|---|---|---|---|---|
| 0 | Air | 1000 | Above 90 | Inferior |
|   | Nitrogen | 600 | Above 90 | Inferior |
|   | Hydrogen | 300 | Above 90 | Inferior |
| 0.6 | Air | 600 | Above 90 | Medium |
|   | Nitrogen | 400 | Above 90 | Medium |
|   | Hydrogen | 180 | Above 90 | Medium |
| 10 | Air | 400 | Above 90 | Superior |
|   | Nitrogen | 300 | Above 90 | Superior |
|   | Hydrogen | 150 | Above 90 | Superior |
| 50 | Air | 300 | Above 90 | Superior |
|   | Nitrogen | 220 | Above 90 | Superior |
|   | Hydrogen | 100 | Above 90 | Superior |

Figure 1:
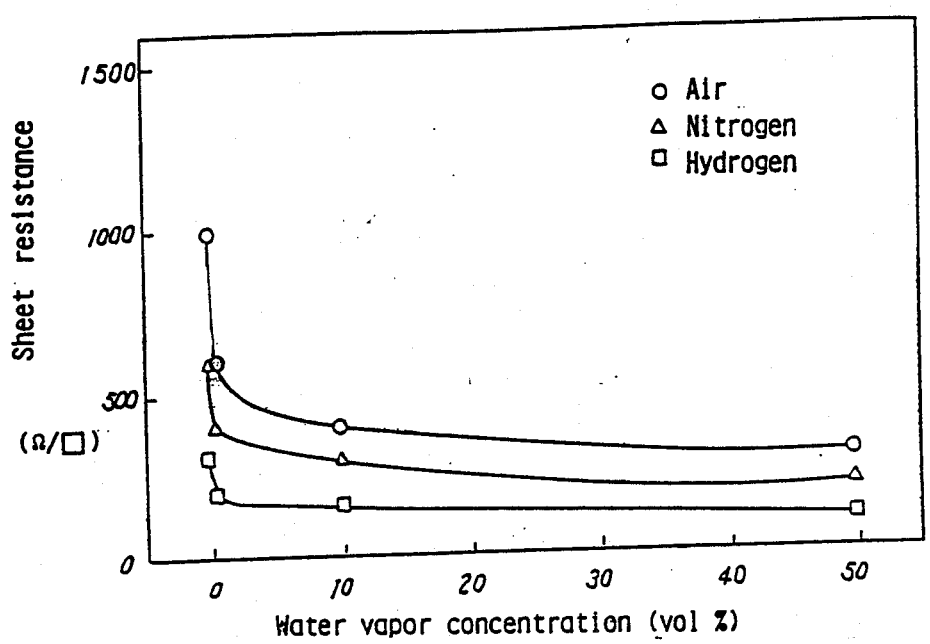
FIG. 1 and FIG. 2 are characteristic diagrams showing characteristics of transparent conductive films embodying the present invention.

As shown in Table 1 and FIG. 1, in each atmosphere, transmittance of the film is above 90 percent regardless of the kind of the heat treatment atmosphere and amount of water vapor contained therein. However, when the water vapor amount is below 0.6 vol %, acid resistance of the film is considerably lost. Electrical resistance of each film becomes lower in the following order: air (oxidative atmosphere), nitrogen (inert atmosphere) and hydrogen (reductive atmosphere).

The above-mentioned characteristics have been confirmed from intensive experiments in plurality of samples, and especially, in a range of 0-20 vol % of water vapor amount in the atmosphere of the heat treatment, many times of experiments have been made.

EXAMPLE 2

A solution prepared with indium triacethylacetonate, dibutyltinbisacethylacetonate (12.5 wt % to indium compound), nitrocellulose and benzyl alcohol is applied by printing method on a soda-lime glass substrate and to form a film. The film is dried, and thereafter it is thermally decomposed by heating it up to 530° C. in the air. Thereafter, the thermally decomposed film is heat-treated at 530° C. for 90 minutes. The heat treatments of samples are carried out in three kinds of atmospheres containing water vapor of an oxidative atmosphere, an inert atmosphere and a reductive atmosphere. Characteristics of resultant transparent conductive films are shown in Table 2 and FIG. 2.

TABLE 2

| Water vapor amount Vol % | Atmosphere of heat treatment | Sheet resistance Ω/□ | Transmittance % | Acid Resistance |
|---|---|---|---|---|
| 0 | Air | 1500 | Above 90 | Inferior |
|   | Nitrogen | 1000 | Above 90 | Inferior |
|   | Hydrogen | 500 | Above 90 | Inferior |
| 0.6 | Air | 900 | Above 90 | Medium |
|   | Nitrogen | 600 | Above 90 | Medium |
|   | Hydrogen | 300 | Above 90 | Medium |
| 10 | Air | 600 | Above 90 | Superior |
|   | Nitrogen | 300 | Above 90 | Superior |
|   | Hydrogen | 200 | Above 90 | Superior |
| 50 | Air | 350 | Above 90 | Superior |
|   | Nitrogen | 200 | Above 90 | Superior |
|   | Hydrogen | 100 | Above 90 | Superior |

Figure 2:
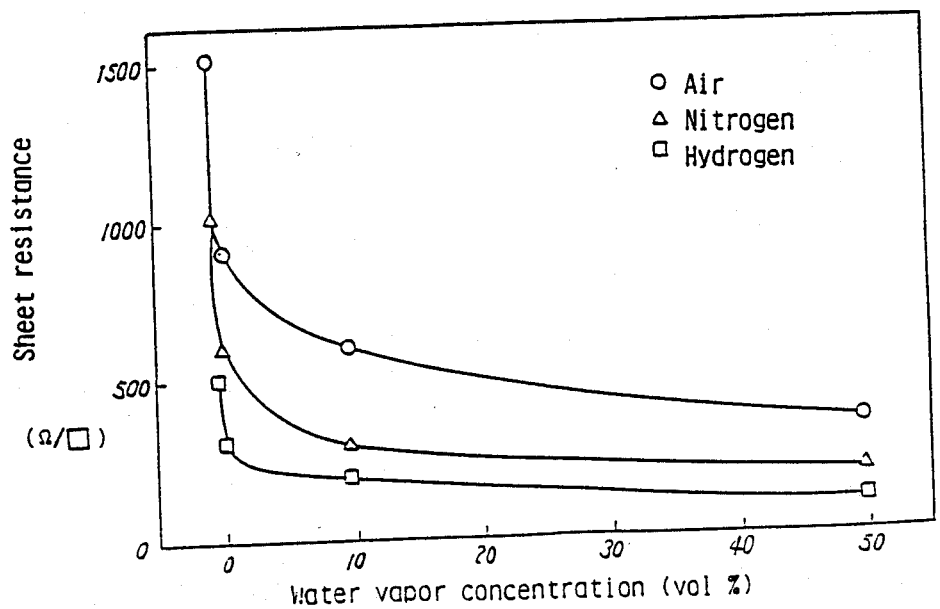

As shown in Table 2 and FIG. 2, similar result to that of the Example 1 is obtained. The above-mentioned characteristics are confirmed in a plurality of samples.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method for making transparent conductive film comprising the steps of:

(a) applying a solution of an organic indium compound and an organic tin compound in a solvent to a substrate to form a film;
(b) subjecting the film to thermal decomposition by heat treatment, and
(c) subjecting the thermally decomposed material to heat treatment in an atmosphere containing greater than 0.6% by volume of water vapor.

2. A method for making a transparent conductive film as in claim 1, wherein said solution further comprises a binder.

3. A method for making a transparent conductive film as in claim 1, wherein
said atmosphere containing water vapor is one atmosphere selected from the group consisting of an oxidative atmosphere, an inert atmosphere and a reductive atmosphere.

4. A method for making a transparent conductive film as in claim 1, wherein
said organic indium compound is at least one member selected from the group consisting of crown ether complexes, indium diethylacetoacetate-monoacethyl-acetonate, indium monoethylacetoacetate-diacethyl-acetonate, indium triacethylacetonate, indium trifluoro-acethylacetonate, indium alcoholateacethylacetonates, indium 2-ethylhexanoate, indium octanoate, indium laurate and indium isopropinoate.

5. A method for making a transparent conductive film as in claim 1, wherein
said organic tin compound is at least one member selected from the group consisting of crown ether complexes, tin butyrate, tin 2-ethylhexanoate, tin naphthenate, tin p-toluylate and dibutyltinbisacethyl-acetonate.

6. A method for making a transparent conductive film as in claim 1, wherein the film is dried prior to thermal decomposition.

7. A method for making a transparent conductive film as in claim 2, wherein the binder is selected from the group consisting of cellulose compounds such as nitrocellulose, ethylcellulose, hydroxypropylcellulose, acrylic copolymers, vinyl polymers or copolymers such as polystyrene, or phenolic resins.

8. A method for making a transparent conductive film as in claim 3, wherein said oxidative atmosphere is air.

9. A method for making a transparent conductive film as in claim 3, wherein said inert atmosphere is selected form the group consisting of nitrogen, carbon dioxide or argon.

10. A method for making a transparent conductive film as in claim 3, wherein said reduction atmosphere is selected from the group consisting of hydrogen and an inert gas or hydrogen sulfide.

11. A method for making a transparent conductive film as in claim 1, wherein the solution is applied by a printing method.

* * * * *